(12) United States Patent
He et al.

(10) Patent No.: US 11,249,585 B2
(45) Date of Patent: Feb. 15, 2022

(54) METHOD OF FABRICATING A SUBSTRATE, SUBSTRATE, ELECTRONIC APPARATUS, DISPLAY APPARATUS, AND TOUCH PANEL

(71) Applicants: Hefei Xinsheng Optoelectronics Technology Co., Ltd., Anhui (CN); BOE Technology Group Co., Ltd., Beijing (CN)

(72) Inventors: Xiaoyue He, Beijing (CN); Taofeng Xie, Beijing (CN); Wenjin Fan, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 478 days.

(21) Appl. No.: 16/330,729

(22) PCT Filed: Jun. 5, 2018

(86) PCT No.: PCT/CN2018/089946
§ 371 (c)(1),
(2) Date: Mar. 5, 2019

(87) PCT Pub. No.: WO2019/134343
PCT Pub. Date: Jul. 11, 2019

(65) Prior Publication Data
US 2021/0333965 A1    Oct. 28, 2021

(30) Foreign Application Priority Data

Jan. 2, 2018    (CN) .......................... 201810002260.0

(51) Int. Cl.
*G06F 3/041* (2006.01)
*G06F 3/044* (2006.01)
*H01L 27/32* (2006.01)

(52) U.S. Cl.
CPC ........ *G06F 3/04164* (2019.05); *G06F 3/0412* (2013.01); *G06F 3/0443* (2019.05);
(Continued)

(58) Field of Classification Search
CPC ......... G06F 2203/04103; H01L 27/323; H01L 27/3276; H01L 27/1259; H01L 27/124;
(Continued)

(56) References Cited

U.S. PATENT DOCUMENTS

2010/0276786 A1    11/2010  Cotte et al.
2013/0256899 A1    10/2013  Boyanov et al.
(Continued)

FOREIGN PATENT DOCUMENTS

CN    102301465 A    12/2011
CN    103268180 A     8/2013
(Continued)

OTHER PUBLICATIONS

International Search Report & Written Opinion dated Sep. 27, 2018, regarding PCT/CN2018/089946.
(Continued)

*Primary Examiner* — Sanjiv D. Patel
(74) *Attorney, Agent, or Firm* — Intellectual Valley Law, P.C.

(57) ABSTRACT

The present application provides a method of fabricating a substrate. The method includes forming an insulating material layer on a base substrate; forming a plurality of channels extending into the insulating material layer; and forming a plurality of signal lines respectively in the plurality of channels. Each individual one of the plurality of signal lines is formed on a lateral side of a respective one of the plurality of channels.

12 Claims, 10 Drawing Sheets

(52) U.S. Cl.
CPC .. *G06F 2203/04103* (2013.01); *H01L 27/323* (2013.01); *H01L 27/3276* (2013.01)

(58) Field of Classification Search
CPC . H01L 2251/558; H01L 27/127; H05K 3/107; H05K 2201/0969; H05K 2201/09827; G02F 1/155; G02F 1/133308; G02F 1/13452; G02F 1/1533; G02F 1/133388; G02F 1/1343
See application file for complete search history.

(56) References Cited

U.S. PATENT DOCUMENTS

2014/0293142 A1* 10/2014 Kawazu ............ G03B 21/2073
 349/5
2015/0035792 A1 2/2015 Roziere et al.
2015/0270224 A1* 9/2015 Boyanov ............. H01L 21/7684
 257/751

FOREIGN PATENT DOCUMENTS

| CN | 103823595 A | 5/2014 |
| CN | 103842862 A | 6/2014 |
| CN | 104025261 A | 9/2014 |
| CN | 106547397 A | 3/2017 |
| CN | 106933417 A | 7/2017 |

OTHER PUBLICATIONS

First Office Action in the Chinese Patent Application No. 201810002260.0, dated May 30, 2019; English translation attached.
Third Office Action in the Chinese Patent Application No. 201810002260.0, dated Mar. 12, 2021; English translation attached.

* cited by examiner

METHOD OF FABRICATING A SUBSTRATE, SUBSTRATE, ELECTRONIC APPARATUS, DISPLAY APPARATUS, AND TOUCH PANEL

CROSS-REFERENCE TO RELATED APPLICATION

This application is a national stage application under 35 U.S.C. § 371 of International Application No. PCT/CN2018/089946, filed Jun. 5, 2018, which claims priority to Chinese Patent Application No. 201810002260.0, filed Jan. 2, 2018, the contents of which are incorporated by reference in the entirety.

TECHNICAL FIELD

The present invention relates to display technology, more particularly, to a method of fabricating a substrate, a substrate, an electronic apparatus, a display apparatus, and a touch panel.

BACKGROUND

With the development of display technology, touch screen panels and display panels are wildly used. A touch screen panel includes a touch-control area and a peripheral area having a plurality of signal lines. The touch-control area is an area where a plurality of touch electrodes is disposed. The peripheral area is an area where a plurality of touch electrode signal lines is disposed connecting with the plurality of touch electrodes respectively. A display panel includes a display area and a peripheral area having a plurality of signal lines. The display area is an area where a plurality of pixels is disposed. The peripheral area is an area where a plurality of signal lines is disposed connecting with a plurality of electrodes or electrode wires in the display area. The peripheral areas of both touch screen panels and display panels are usually encapsulated as bezels of touch screen panels and display panels.

SUMMARY

In one aspect, the present invention provides a method of fabricating a substrate, comprising forming an insulating material layer on a base substrate; forming a plurality of channels extending into the insulating material layer; and forming a plurality of signal lines respectively in the plurality of channels, each individual one of the plurality of signal lines being formed on a lateral side of a respective one of the plurality of channels.

Optionally, each of the plurality of signal lines is formed to have a width substantially along a direction substantially parallel to a main surface of the base substrate in a range of approximately 100 nm to approximately 800 nm.

Optionally, each of the plurality of signal lines is folioed to have a depth substantially along a direction substantially perpendicular to a main surface of the base substrate in a range of approximately 4 µm to approximately 15 µm.

Optionally, the plurality of signal lines are thrilled to have a pitch in a range of approximately 3 µm to approximately 11 µm.

Optionally, each of the plurality of signal lines is formed to have a width substantially along a direction substantially parallel to a main surface of the base substrate and a depth substantially along a direction substantially perpendicular to a main surface of the base substrate; and an aspect ratio between the depth and the width is greater than 5:1.

Optionally, forming the plurality of signal lines respectively in the plurality of channels comprises sputtering a conductive material onto the lateral side of the respective one of the plurality of channels; wherein sputtering the conductive material is performed along a sputtering direction inclined with respect to a plane substantially parallel to a main surface of the base substrate.

Optionally, an inclined angle between the sputtering direction and the plane substantially parallel to the main surface of the base substrate is in a range of approximately 30 degrees to approximately 60 degrees.

Optionally, subsequent to forming the plurality of signal lines respectively in the plurality of channels, the method further comprises filling the plurality of channels using an insulating material thereby forming an insulating layer; and removing a portion of the plurality of signal lines protruding outwardly along a direction away from the base substrate thereby substantially leveling an exposed surface of the plurality of signal lines and an exposed surface of insulating layer.

Optionally, removing the portion of the plurality of signal lines comprises etching the portion of the plurality of signal lines with an acidic etchant.

Optionally, subsequent to filling the plurality of channels, the method further comprises forming a plurality of recesses in the insulating layer, each individual one of the plurality of recesses being formed to abut a respective one of the plurality of signal lines, thereby exposing a lateral, surface of the respective one of the plurality of signal lines; and forming a plurality of conductive connectors respectively in the plurality of recesses, each individual one of the plurality of conductive connectors is electrically connected to the respective one of the plurality of signal lines.

Optionally, subsequent to forming the plurality of conductive connectors, the method further comprises forming a plurality of connecting signal lines on a side of the insulating layer distal to the base substrate, each individual one of the plurality of connecting signal lines being electrically connected to a respective one of the plurality of conductive connectors.

Optionally, each of the plurality of channels is formed to have a width substantially along a direction substantially parallel to a main surface of the base substrate and a depth substantially along a direction substantially perpendicular to a main surface of the base substrate; the width is in a range of approximately 1 µm to approximately 6 µm; and the depth is in a range of approximately 4 µm to approximately 15 µm.

Optionally, the insulating material layer is made of one or a combination of acrylate and a protection film.

Optionally, forming the plurality of channels comprises exposing and developing the insulating material layer.

In one aspect, the present invention provides a substrate comprising a base substrate; an insulating layer on the base substrate; and a plurality of signal lines at least partially embedded in the insulating layer; wherein each of the plurality of signal lines has a width substantially along a direction substantially parallel to a main surface of the base substrate in a range of approximately 100 nm to approximately 800 nm.

Optionally, each of the plurality of signal lines has a depth substantially along a direction substantially perpendicular to a main surface of the base substrate in a range of approximately 4 µm to approximately 15 µm.

Optionally, each of the plurality of signal lines has a width substantially along a direction substantially parallel to a main surface of the base substrate and a depth substantially along a direction substantially perpendicular to a main surface of the base substrate; and an aspect ratio between the depth and the width is greater than 5:1.

Optionally, the plurality of signal lines have a pitch in a range of approximately 3 µm to approximately 11 µm.

Optionally, the substrate further comprises a plurality of conductive connectors at least partially embedded in the insulating layer, each individual one of the plurality of conductive connectors is electrically connected to a respective one of the plurality of signal lines.

Optionally, the substrate further comprises a plurality of connecting signal lines on a side of the insulating layer distal to the base substrate, each individual one of the plurality of connecting signal lines being electrically connected to a respective one of the plurality of conductive connectors.

Optionally, the plurality of signal lines comprises one or a combination of copper, aluminum, and silver.

Optionally, the insulating layer comprises one or a combination of actylate and a protection film.

In one aspect, the present invention provides an electronic apparatus comprising the substrate described herein or fabricated by a method described herein.

In one aspect, the present invention provides a display apparatus comprising the substrate described herein or fabricated by a method described herein.

In one aspect, the present invention provides a touch panel comprising the substrate described herein or fabricated by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In a conventional method of fabricating a substrate, the peripheral area of the substrate is an area where a plurality of signal lines is disposed. The width of each of the signal lines is at least 10000 nm. Because a large number of signal lines are disposed on the peripheral area, a frame of a touch screen panel or a display panel is inevitably relatively wide.

Figure 1A:
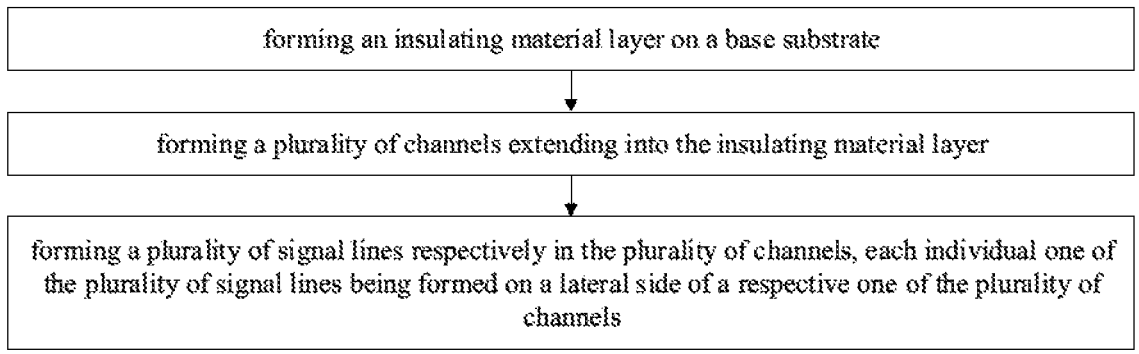
FIG. 1A is a flow chat illustrating a method of fabricating a substrate in some embodiments according to the present disclosure.

Accordingly, the present disclosure provides, inter alia, a method of fabricating a substrate, a substrate, an electronic apparatus, a display apparatus, and a touch panel that substantially obviate one or more of the problems due to limitations and disadvantages of the related art. In one aspect, the present disclosure provides a method of fabricating a substrate, FIG. 1A is a flow chat illustrating a method of fabricating a substrate in some embodiments according to the present disclosure, Referring to FIG. 1A, the method in some embodiments includes forming an insulating material layer on a base substrate; forming a plurality of channels extending into the insulating material layer; and forming a plurality of signal lines respectively in the plurality of channels, each individual one of the plurality of signal lines being formed on a lateral side of a respective one of the plurality of channels. Optionally, the plurality of channels are formed to extend along a direction substantially parallel to a main surface of the base substrate.

Optionally, the substrate fabricated by the present method is a substrate of a touch panel. Optionally, the substrate fabricated by the present method is a substrate of a display panel. Optionally, the substrate is fabricated on a base substrate of a touch panel. Optionally, the substrate is fabricated on a base substrate of a display panel such as a flexible display panel, a curved display panel, and an organic light-emitting diode display panel.

In some embodiments, the insulating material layer is formed directly on the base substrate, Optionally, the insulating material layer is in direct contact with (e.g. without any intermediate structure or layer) the base substrate. In some embodiments, the insulating material layer is formed indirectly on the base substrate. Optionally, the insulating material layer is not in direct contract with the base substrate, but formed on an intermediate layer on the base substrate. For example, an intermediate layer is first formed on the base substrate, an insulating material layer is then formed on a side of the intermediate layer distal the base substrate.

In one example, the plurality of signal lines are a plurality of data lines. In a process of forming a display panel, a gate electrode layer (e.g. gate lines), a gate insulating layer, and an active layer are formed on a base substrate, Prior to forming the plurality of data lines, the insulating material layer is formed on a side of the active layer distal to the substrate. Subsequent to forming the insulating material layer, the plurality of data lines are formed on a side of the insulating material layer distal to the base substrate.

Various appropriate materials and various appropriate fabricating methods may be used for making the base substrate. Examples of materials suitable for making the base substrate include, but are not limited to, glass, quartz, polyimide, and polyester, etc.

Various appropriate insulating materials and various appropriate fabricating methods may be used to make the insulating material layer. For example, an insulating material may be deposited on the substrate by a plasma-enhanced chemical vapor deposition (PECVD) process. Examples of appropriate insulating materials for making the insulating layer include, but are not limited to, acrylic materials, silicon oxide ($SiO_y$), silicon nitride ($SiN_y$, e.g., $Si_3N_4$), silicon oxynitride ($SiO_xN_y$), polyimide and other over coating materials.

In some embodiments, a plurality of channels extends into a side of the insulating material layer distal to the base substrate. Optionally, the plurality of channels are substantially parallel to each other. Optimally, the plurality of channels are evenly spaced apart, e.g., the distances between any two adjacent channels are substantially same.

Figure 1B:
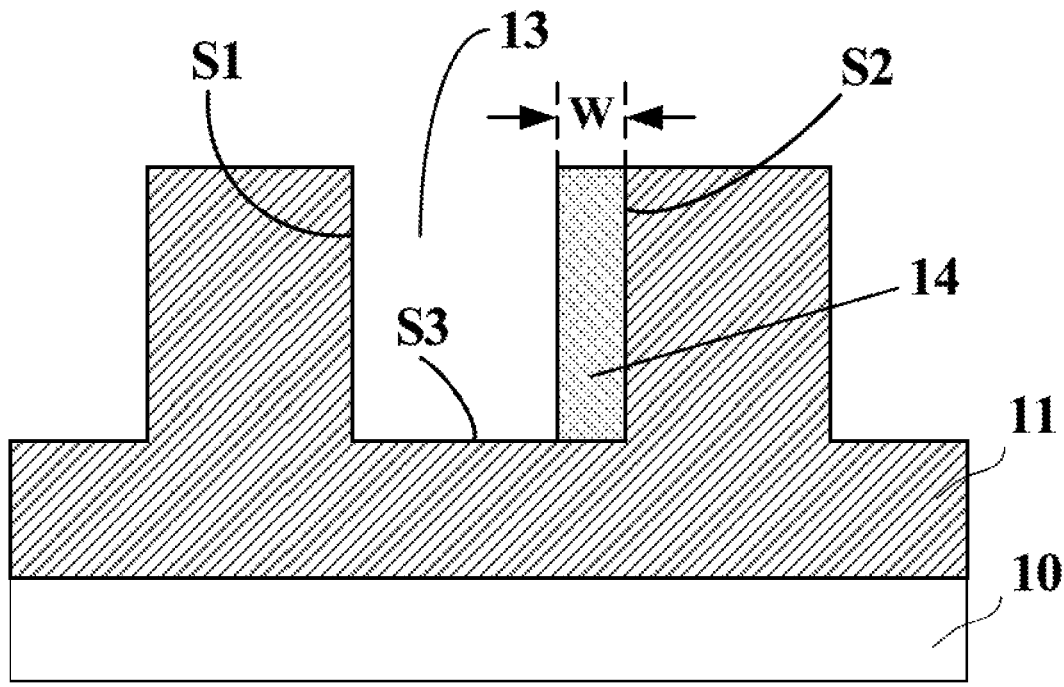
FIG. 1B is a partial cross-sectional view of a substrate in some embodiments according to the present disclosure.

FIG. 1B is a partial cross-sectional view of a substrate in some embodiments according to the present disclosure. Referring to FIG. 1B, an insulating material layer 11 is formed on a base substrate 10, a plurality of channels 13 are formed in the insulating material layer 11, and a plurality of signal lines 14 are respectively formed in the plurality of channels 13. Each individual one of the plurality of signal lines 14 is formed on a lateral side of a respective one of the plurality of channels 13. As shown in FIG. 1B, each of the plurality of channels 13 has a first side S1, a second side S2 facing the first side S1, and a third side S3 connecting the first side S1 and the second side S2, e.g., the third side S3 connecting the ends of the first side S1 and the second side S2 facing the base substrate 10. One of the plurality of signal lines 14 is formed on a lateral side of the one of the plurality of channels 13. Optionally, the lateral side is the second side S2, as shown in FIG. 1B. Optionally, the lateral side if the first side S1.

In some embodiments, each of the plurality of signal lines is formed to have a width substantially along a direction substantially parallel to a main surface of the base substrate in a range of approximately 100 nm to approximately 800 nm. Referring to FIG. 1B, each of the plurality of signal lines 14 is formed to have a width W substantially along a direction from the second side S2 toward the first side S1. Optionally, the width W is in a range of approximately 100 nm to approximately 800 nm, e.g., approximately 100 nm to approximately 200, approximately 200 nm to approximately 300, approximately 300 nm to approximately 400, approximately 400 nm to approximately 500, approximately 500 nm to approximately 600, approximately 600 nm to approximately 700, and approximately 700 nm to approximately 800.

In some embodiment, the plurality of signal lines 14 is respectively formed in the plurality of channels 13. Optionally, the plurality of channels 13 are substantially parallel to each other, and the plurality of signal lines 14 in the plurality of channels 13 are also substantially parallel to each other.

In some embodiments, subsequent to forming the plurality of signal lines respectively in the plurality of channels, the method further includes filling the plurality of channels using an insulating material thereby forming an insulating layer.

In some embodiments, subsequent to forming the plurality of signal lines respectively in the plurality of channels, the method further includes forming an additional layer on a side of the insulating material layer distal to the base substrate, thereby filling the plurality of channels. In one example, the method includes forming an electrode insulating layer on a side of the plurality of channels distal to the base substrate, the material of the electrode insulating layer fills in the plurality of channels.

In the present method, a plurality of channels are folioed in the insulating material layer, and a plurality of signal lines are respectively formed in the plurality of channels. A width of a plurality of the signal lines substantially along a direction substantially parallel to a main surface of the base substrate (e.g., substantially along a direction from the second side S2 toward the first side S1) in a range of approximately 100 nm to approximately 800 nm can be achieved. Thus, ultrathin signal lines can be achieved, thereby greatly reducing the width of a peripheral area of the substrate (e.g., a peripheral area of a display panel or a peripheral area of a touch panel). A display apparatus having a narrow frame can be easily achieved by using a substrate fabricating by the present method. Another advantage of having ultrathin signal lines in the peripheral area is that ultrathin signal lines are less visible or not visible at all, making it possible to fabricating an apparatus with a substantially transparent frame.

Figure 2A:
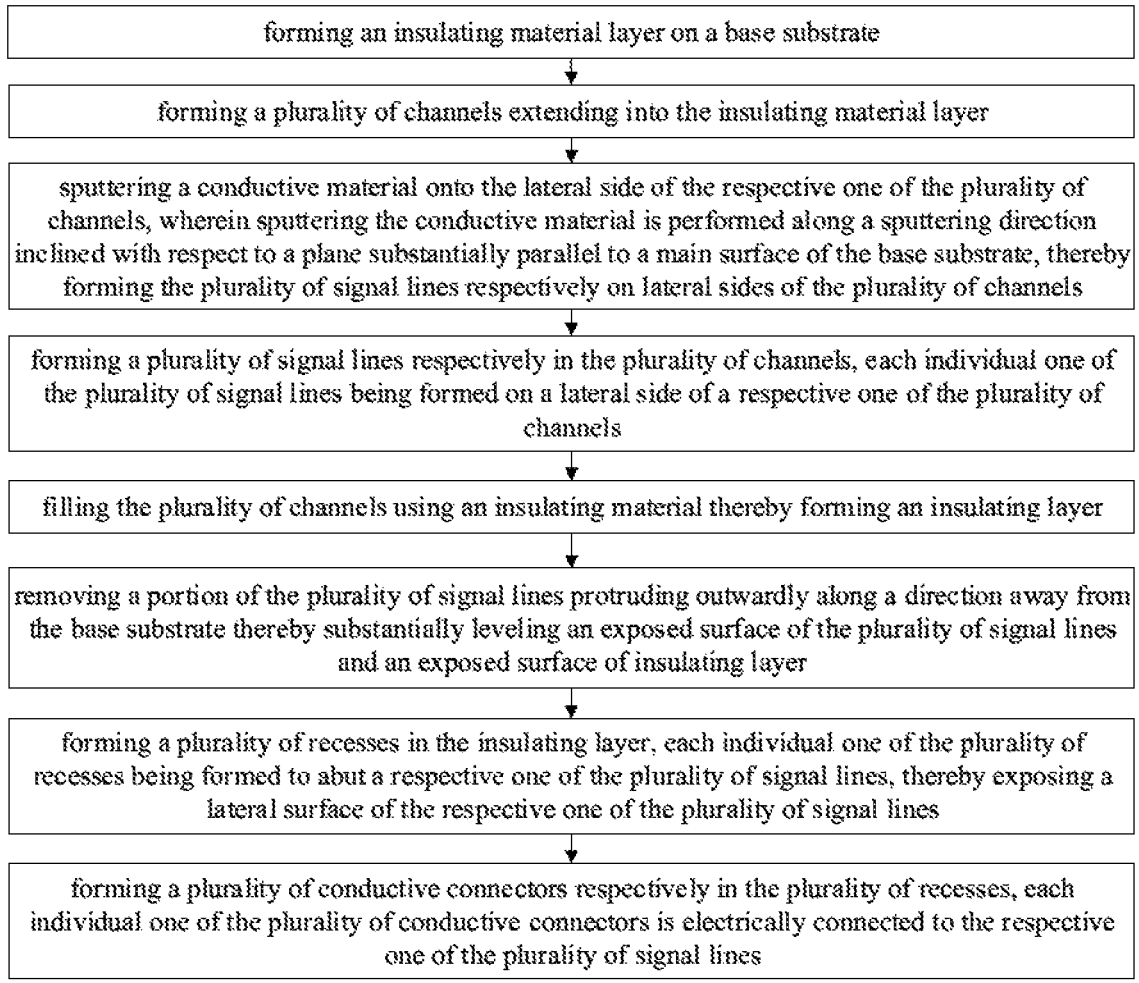
FIG. 2A is a flow chat illustrating a method of fabricating a substrate in some embodiments according to the present disclosure.

FIG. 2A is a flow chat illustrating a method of fabricating a substrate in some embodiments according to the present disclosure. Referring to FIG. 2A, a method of fabricating a base substrate in some embodiments includes forming an insulating material layer on a base substrate; forming a plurality of channels extending into the insulating material layer; sputtering a conductive material onto the lateral side of the respective one of the plurality of channels, wherein sputtering the conductive material is performed along a sputtering direction inclined with respect to a plane substantially parallel to a main surface of the base substrate, thereby forming the plurality of signal lines respectively on lateral sides of the plurality of channels; forming a plurality of signal lines respectively in the plurality of channels, each individual one of the plurality of signal lines being formed on a lateral side of a respective one of the plurality of channels; filling the plurality of channels using an insulating material thereby fruiting an insulating layer; removing a portion of the plurality of signal lines protruding outwardly along a direction away from the base substrate thereby substantially leveling an exposed surface of the plurality of signal lines and an exposed surface of insulating layer; forming a plurality of recesses in the insulating layer, each individual one of the plurality of recesses being formed to abut a respective one of the plurality of signal lines, thereby exposing a lateral surface of the respective one of the plurality of signal lines; and forming a plurality of conductive connectors respectively in the plurality of recesses, each individual one of the plurality of conductive connectors is electrically connected to the respective one of the plurality of signal lines.

Various appropriate materials and various appropriate fabricating methods may be used for making the base substrate. Examples of materials suitable for making the base substrate include, but are not limited to, glass, quartz, polyimide, and polyester, etc.

Various appropriate insulating materials and various appropriate fabricating methods may be used to make the insulating material layer. For example, an insulating material may be deposited on the substrate by a plasma-enhanced chemical vapor deposition (PECVD) process. Examples of appropriate insulating materials for making the insulating layer include, but are not limited to, acrylic materials, silicon oxide ($SiO_y$), silicon nitride ($SiN_y$, e.g., $Si_3N_4$), oxynitride ($SiO_xN_y$), polyimide and other overcoat materials. Optionally, the insulating material layer is formed on a side of the base substrate using acrylic materials or overcoat materials. Optionally, the insulating material layer is formed to have a thickness along a direction substantially perpendicular to a main surface of the base substrate in a range of approximately 5 μm to 20 μm e.g., approximately 5 μm to approximately 10 μm approximately 10 μm to approximately 15 μm and approximately 15 μm to approximately 20 μm. Optionally, subsequent to leveling the insulating material layer (e.g., the acrylic material layer and the overcoat material layer), the insulating material layer is then cured, e.g., under 230° C. for a duration of approximately 30 minutes.

In some embodiments, forming a plurality of channels extending into the insulating material layer includes exposing and developing the insulating material layer, thereby forming the plurality of channels extending into the insulating material layer. Optionally, the insulating material layer includes a negative photoresist material (e.g., a negative photoresist acrylic material and a negative photoresist overcoat material). In one example, a mask plate is used for exposing the insulating material layer made of a negative photoresist material. Subsequent to exposing process, the insulating material layer is developed to remove a portion of the insulating material layer in a substantially unexposed region, thereby forming the plurality of channels.

Figure 2B:
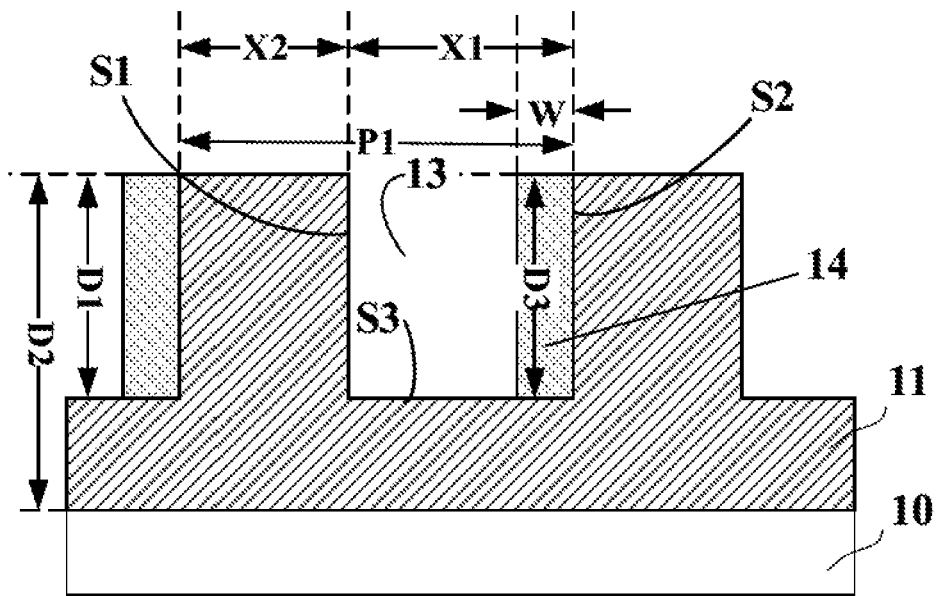
FIG. 2B is a partial cross-sectional view of a substrate in some embodiments according to the present disclosure.

FIG. 2B is a partial cross-sectional view of a substrate in some embodiments according to the present disclosure. Referring to FIG. 2B, an insulating material layer 11 is formed on a base substrate 10, a plurality of channels 13 are formed in the insulating material layer 11, and a plurality of signal lines 14 are respectively formed in the plurality of channels 13. Each individual one of the plurality of signal lines 14 is formed on a lateral side of a respective one of the plurality of channels 13.

As shown in FIG. 2B, each of the plurality of channels 13 is formed to have a depth D1 substantially along a direction substantially perpendicular to a main surface of the base substrate, e.g., substantially along a direction from the base substrate 10 toward the insulating material layer 11. The insulating material layer 12 has a depth D2 substantially along a direction substantially perpendicular to a main surface of the base substrate. Optionally, the depth D1 is less than the depth D2. Optionally, the depth D1 is in a range of approximately 4 μm to approximately 15 μm, e.g., approximately 4 μm to approximately 8 μm, approximately 8 μm to approximately 12 μm, and approximately 12 μm to approximately 15 μm.

As shown in FIG. 2B, each of the plurality of channels 13 is formed to have, a width X1 substantially along a direction substantially parallel to a main surface of the base substrate 10, e.g., substantially along a direction from the first side S1 toward the second side S2. Optionally, the width X1 is in a range of approximately 1 μm to 6 μm e.g., approximately 1 μm to approximately 3 μm approximately 3 μm to approximately 5 μm, and approximately 5 μm to approximately 6 μm.

In some embodiments, an aspect ratio between the depth D1 and the width X1 (D1:X1) is greater than 1:1. Optionally, the aspect ratio between the depth D1 and the width X1 (D1:X1) is in a range of approximately 1:1 to approximately 15:1, e.g., approximately 1:1 to approximately 5:1, approximately 5:1 to approximately 10:1, approximately 10:1 to approximately 15:1. Optionally, the aspect ratio between e depth D1 and the width X1 (D1:X1) is greater than 5:1.

Optionally, the plurality of channels 13 are formed to have the depth D1 in a range such that a depth D3 of each of the plurality of the signal lines 14 substantially along a direction substantially perpendicular to a main surface of the base substrate 10 is sufficiently large (e.g., in a range of approximately 4 μm to approximately 15 μm), and a resistance of each of the plurality of the signal lines 14 is in an appropriate range, e.g., relatively small.

Optionally, the distance X2 between any adjacent channels of the plurality of channels 13 is in a range of approximately 2 μm to approximately 5 μm e.g., approximately 2 μm to approximately 3 μm, approximately 3 μm to approximately 4 μm, and approximately 4 μm to approximately 5 μm which guarantees that a distance between any adjacent signal lines of the plurality of signal lines 14 respectively on the adjacent channels is relatively small.

Optionally, the plurality of signal lines 14 are formed to have a pitch P1. Optionally, the pitch P1 is in a range of approximately 3 μm to approximately 11 μm, e.g., approximately 3 μm to approximately 4 μm, approximately 4 μm to approximately 5 μm, approximately 5 μm to approximately 6 μm, approximately 6 μm to approximately 7 μm, approximately 7 μm to approximately 8 μm, approximately 8 μm to approximately 9 μm, approximately 9 μm to approximately 10 μm, and approximately 10 μm to approximately 11 μm. By having the plurality of signal lines 14 with a small pitch P1, a width of the peripheral area having the plurality of signal lines 14 can be made relatively small, thereby achieving a narrow frame.

Figure 2C:
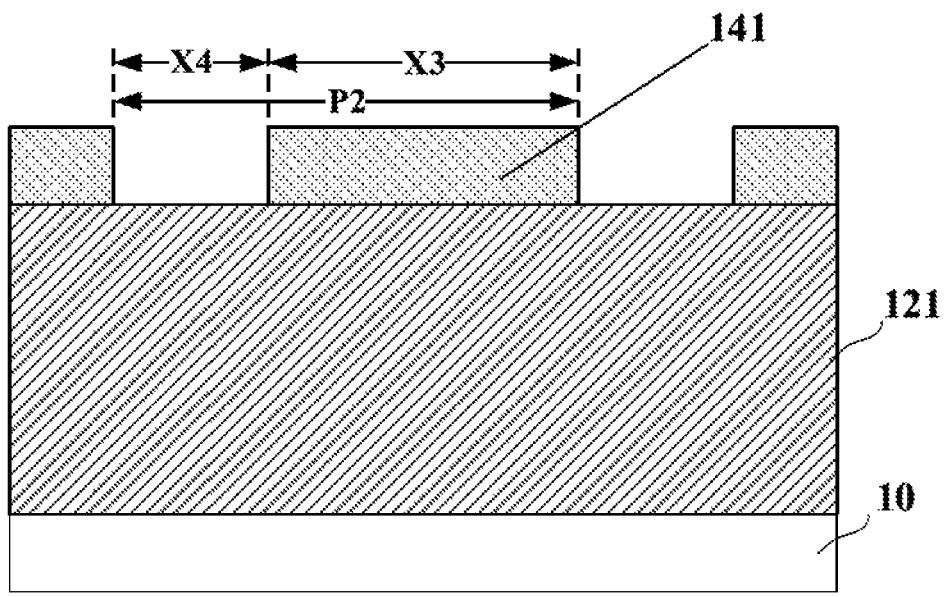
FIG. 2C is a partial cross-sectional view of a conventional substrate.

FIG. 2C is a partial cross-sectional view of a conventional substrate. Referring to FIG. 2C, the conventional substrate includes a plurality of metal lines 141 on a side of an insulating layer 121 distal to a base substrate 10, each of which has a width X3 at least greater than 10 μm. The distance X4 between adjacent metal lines of the plurality of metal lines 141 is typically required to be in a range of 2 μm to 5 μm. Accordingly, the plurality of metal lines 141 in the conventional substrate have a width X3 significantly greater than the width W of the plurality of signal lines 14 as shown in FIG. 2B. Optionally, X3:W is at least greater than 10, e.g., greater than 12.5. Optionally, X3:W is in a range of approximately 10 to approximately 100, e.g., approximately 10 to approximately 25, approximately 25 to approximately 50, approximately 50 to approximately 75, and approximately 75 to approximately 100. Optionally, X3:W is greater than 100. Moreover, the plurality of metal lines 141 in the conventional substrate have a pitch P2 in a range of at least approximately 12 μm to approximately 15 μm, much greater than the pitch P1 of the plurality of signal lines 14 in FIG. 2B. Optionally, P2:P1 is at least greater than 1, e.g., greater than 2, greater than 3, greater than 4, and greater than 5. Further, forming the plurality of channels in the present disclosure involves only exposure, development, and sputtering processes. In contrast, forming signal lines in the conventional substrate involves much more complicated processes such as etching metal lines using wet etching or dry etching. The present method obviates complicated fabricating processes required in the conventional method, and can achieve a much higher accuracy.

In one example, and referring to FIG. 2B, the depth D1 of the plurality of channels 13 substantially along a direction substantially perpendicular to a main surface of the base substrate 10 (e.g., substantially along a direction from the base substrate 10 toward the insulating material layer 11) is approximately 15 μm, the width X1 of each of the plurality of channels 13 substantially along a direction substantially parallel to a main surface of the base substrate 10 (e.g., substantially along a direction from the first side S1 toward the second side S2) is approximately 3 μm, and the distance X2 between any adjacent channels of the plurality of channels 13 is approximately 2 μm.

In some embodiment, referring to FIG. 2A, subsequent to forming the plurality of channels, the base substrate is disposed into a sputtering chamber to sputter a conductive material onto the lateral sides of the plurality of channels. Optionally, sputtering the conductive material is performed along a sputtering direction inclined with respect to a plane substantially parallel to a main surface of the base substrate.

Optionally, an inclined angle between the sputtering direction and the plane substantially parallel to the main surface of the base substrate is in a range of approximately 10 degrees to approximately 70 degrees, e.g., approximately 10 degrees to approximately 20 degrees, approximately 20 degrees to approximately 30 degrees, approximately 30 degrees to approximately 40 degrees, approximately 40 degrees to approximately 50 degrees, approximately 50 degrees to approximately 60 degrees, and approximately 60 degrees to approximately 70 degrees.

In some embodiment, referring to FIG. 2A, a plurality of signal lines is respectively formed in the plurality of channels. Optionally, each of the plurality of signal lines is formed on the first side S2. Optionally, each of the plurality of signal lines is formed on the second side S2 (referring to FIG. 2B). Optionally, each of the plurality of signal lines is formed to have a width substantially along a direction substantially parallel to a main surface of the base substrate (e.g., substantially along a direction from the second side toward the first side) is in a range of appropriately 100 nm to appropriately 800 nm, e.g., approximately 100 nm to approximately 200, approximately 200 nm to approximately 300, approximately 300 nm to approximately 400, approximately 400 nm to approximately 500, approximately 500 nm to approximately 600, approximately 600 nm to approximately 700, and approximately 700 nm to approximately 800.

In some embodiments, forming a plurality of signal lines respectively in the plurality of channels includes using a sputtering process to form the plurality of signal lines respectively in the plurality of channels. Optionally, in the sputtering process, the base substrate is inclined with respect to the horizontal level, to guarantee that the widths of the signal lines are short.

In some embodiments, the signal line is formed using plasma chemical vapor deposition or plasma enhanced chemical vapor deposition (PECVD) process. Optionally, the plasma chemical vapor deposition or plasma enhanced chemical vapor deposition (PECVD) process applies directional bombardment to a metallic target, so that metal ions are ejected from the metallic target along a vertical direction toward the horizontal level. Therefore, the metal ions deposit on the surfaces of the lateral side(s) (e.g., at least one of the lateral side) of the plurality of the plurality of channels. In some embodiments, in a relatively stable vacuum state, a glow discharge occurs between the anode and the cathode, therefore, gas molecules in the poles are ionized to generate electric charges. The positive ions are accelerated by the negative potential of the cathode to hit the metallic target on the cathode, which ejects the metal ions or other particles. The ejected metal ions deposit on the plurality of the second side of the plurality of the plurality of channels forming a plurality of thin films (i.e. the signal lines).

In some embodiments, and referring to FIG. 2B, a depth D3 of the signal line substantially along a direction substantially perpendicular to a main surface of the base substrate (e.g., substantially along a direction from the base substrate 10 toward the insulating material layer 11) is in a range of approximately 4 µm to approximately 15 µm, e.g., approximately 4 µm to approximately 5, approximately 5 µm to approximately 6 µm, approximately 6 µm to approximately 7 µm, approximately 7 µm to approximately 8 µm, approximately 8 µm to approximately 9 µm, approximately 9 82 m to approximately 10 µm, approximately 10 µm to approximately 11 µm, approximately 11 µm to approximately 12 µm, approximately 12 µm to approximately 13 µm, approximately 13 µm to approximately 14 µm, and approximately 14 µm to approximately 15 µm. By having the depth D3 in this range, the resistance of each of the plurality of the signal lines 14 can be in an appropriate range, relatively small.

Optionally, a width W of the signal line 14 along a direction substantially parallel to a main surface of the base substrate (e.g., substantially from the second side S2 toward the first side S1) is in a range of approximately 100 nm to approximately 800 nm, e.g., approximately 100 nm to approximately 200, approximately 200 nm to approximately 300, approximately 300 nm to approximately 400, approximately 400 nm to approximately 500, approximately 500 nm to approximately 600, approximately 600 nm to approximately 700, and approximately 700 nm to approximately 800.

In some embodiments, an aspect ratio between the depth D3 and the width W (D3:W) is greater than 1:1. Optionally, the aspect ratio between the depth D3 and the width W (D3:W) is in a range of approximately 1:1 to approximately 15:1, e.g., approximately 1:1 to approximately 5:1, approximately 5:1 to approximately 10:1, approximately 10:1 to approximately 15:1. Optionally, the aspect ratio between the depth D3 and the width W (D3:W) is greater than 5:1, e.g., approximately 5:1 to approximately 50:1, approximately 50:1 to approximately 100:1, approximately 100:1 to approximately 150:1.

Optionally, the plurality of signal lines 14 have a pitch P1. Optionally, the pitch P1 is in a range of approximately 3 µm to approximately 11 µm, e.g., approximately 3 µm to approximately 4 µm, approximately 4 µm to approximately 5 µm, approximately 5 µm to approximately 6 µm, approximately 6 µm to approximately 7 µm, approximately 7 µm to approximately 8 µm, approximately 8 µm to approximately 9 µm, approximately 9 µm to approximately 10 µm, and approximately 10 µm to approximately 11 µm.

Various appropriate conductive materials and various appropriate fabricating methods may be used for making the plurality of signal lines 14. For example, a conductive material may be sputtered onto the lateral sides of the plurality of channels 13 as described above. Examples of appropriate conductive materials for making the plurality of signal lines 14 include, but are not limited to, various metal materials such as nano-silver, molybdenum, aluminum, silver, chromium, tungsten, titanium, tantalum, copper, and alloys or laminates containing the same; and various conductive metal oxides such as indium tin oxide. Optionally, the plurality of signal lines 14 are made of Cu, Al, or Ae.

In some embodiments, referring to FIG. 2A, the plurality of channels is filled with an insulating material to form an insulating layer. Optionally, a surface of the filled insulating material (e.g., a surface of the insulating layer) distal to the base substrate is substantially leveled up to the exposed surface of the insulating material layer. Optionally, the filled insulating materials protrude outwardly above the exposed surface of the insulating material layer. Optionally, during the step of filling the insulating material, the insulating material covers the surface of the insulating material layer underneath, thereby planarizing the surface of the insulating material layer. Optionally, the insulating material may be the same material as the one of the insulating material layer, e.g., acrylic materials, silicon oxide ($SiO_y$), silicon nitride ($SiN_y$, e.g., $Si_3N_4$), silicon oxynitride ($SiO_xN_y$), polyimide and other overcoat materials. By filing the plurality of the plurality of channels, it is convenient to perform subsequent process or to form other layers.

In some embodiments, subsequent to forming the plurality of signal lines respectively in the plurality of channels, the method further includes forming an additional layer on a side of the insulating material layer distal to the base substrate, thereby filling the plurality of channels. In one example, the method includes forming an electrode insulating layer on a side of the plurality of channels distal to the base substrate, the material of the electrode insulating layer fills in the plurality of channels.

In some embodiments, filling the plurality of channels with the insulating material is performed by a coating process. Optionally, the coating process is performed by a coating machine. By coating, the plurality of channels is filled with insulating materials. Optionally, the surface of the insulating material filled in the plurality of channels distal to the base substrate is leveled up to the exposed surface of the insulating material layer. During the coating process, the insulating material may cover a portion of the plurality of signal lines on a side distal to the base substrate, resulting in an enhanced thickness of the substrate.

The plurality of signal lines initially may be formed to protrude outwardly along a direction away from the base substrate, potentially resulting in a connection between the metallic material of adjacent signal lines, e.g., a short between adjacent signal lines. Optionally, the portion of the plurality of signal lines protruding outwardly along a direction away from the base substrate is first removed to obviate the short problem. However, if the plurality of signal lines are covered by the insulating material, the portion of the plurality of signal lines protruding outwardly cannot be easily removed.

To avoid the above-mentioned problems, the method in some embodiments further includes performing surface finish on the insulating layer coated with the insulating material until the metal material of the plurality of signal lines protrude outward is exposed. Optionally, the process of surface finish is performed in a manner similar to the process of forming the plurality of channels extending into the insulating material layer. Optionally, the insulating layer is made of acrylic materials or overcoat materials. Optionally, the insulating layer is made of a negative photoresist material (e.g., a negative acrylic photoresist material or a negative overcoat photoresist material), which can be directly developed without exposure. In addition, the developing agent has no effect on the plurality of signal lines. In one example, the substrate is disposed in the developing agent until the metal material of the plurality of signal lines protruding outwardly is exposed.

In some embodiments, there is no specific requirement for the thickness of the base substrate, and there is no short between adjacent signal lines (i.e. the adjacent signal lines do not connect with each other), it is not required to perform the surface finish process described above. For example, the subsequently formed electrodes or electrode lines are formed to connect to the plurality of signal lines through vias extending through the insulating layer.

In some embodiments, and referring to FIG. 2A, the method further includes removing a portion of the plurality of signal lines protruding outwardly along a direction away from the base substrate thereby substantially leveling an exposed surface of the plurality of signal lines and an exposed surface of insulating layer. For example, portion of the signal line protruding outwardly along a direction away from the base substrate is removed, thereby the surface of the signal line and the exposed surface of insulating layer are leveled. This process can remove the metallic materials sputtered on the surface between adjacent channels distal to the base substrate to avoid the risk of short in circuit.

In some embodiments, the step of removing the portion of the plurality of signal lines protruding outwardly along a direction away from the base substrate includes etching the portion of the plurality of signal lines protruding outwardly along a direction away from the base substrate with an acidic etchant. Optionally, the acidic etchant is a weak acidic etching solution. Optionally, etching includes wet etching which can effectively remove the portion of the plurality of signal line protruding outwardly along a direction away from the base substrate, but not eroding the insulating layer and the plurality of signal lines embedded in the insulating layer. Optionally, to remove the portion of the plurality of signal lines protruding outwardly along a direction away from the base substrate, the weak acid etching solution is used to etch last for a duration of approximately 15 s to approximately 20 s. Optionally, the weak acid etching solution is the diluted aqua regia. Optionally, the weak acid etching solution may be other weak acids, including hydrofluoric acid, dilute hydrochloric acid, mixed solution of nitric acid and hydrofluoric acid, based on the specific material used for making the plurality of signal lines.

In some embodiments, although the signal lines are sputtered on a periphery area of a display substrate of a display panel or in a periphery area of a touch-control substrate of a touch screen, the metallic materials may be accidentally sputtered on a display area of a display panel or on a touch-control area of a touch screen. The metallic materials sputtered on the display area or the touch-control area can be removed by using the same method as removing the portion of the signal line protruding outwardly along a direction away from the base substrate.

In some embodiments, when there is no short between the adjacent lines, removing a portion of the signal line protruding outwardly along a direction away from the base substrate is not required.

In some embodiments, and referring to FIG. 2A, the method further includes forming a plurality of recesses in the insulating layer, each individual one of the plurality of recesses being formed to abut a respective one of the plurality of signal lines, thereby exposing a lateral surface of the respective one of the plurality of signal lines. Optionally, the process of forming the plurality of recesses is performed in a manner similar to the process for forming the plurality of channels. Optionally, the plurality of recesses recess are formed so that each of the plurality of recesses has a shape, e.g., a cuboid shape and a hemisphere shape. Optionally, a side of the conductive connector formed in the recess distal to the base substrate is flat surface, and a side of the conductive connect facing the base substrate can be various types of surfaces, such as a flat surface, a curved surface, and a slope surface.

In some embodiments, the width of an opening of each of the plurality of recesses along a direction substantially parallel to a main surface of the base substrate (e.g., substantially from the second side toward the first side) is greater than the width of the adjacent signal line of the plurality of signal lines along a same direction, which will guarantee that the area of a surface of the conductive connector distal to the base substrate is greater than the area of the corresponding surface of a respective signal line of the plurality of signal lines. Therefore, the conductive connector can enhance the electrical contact performance between the signal line and a subsequently-formed electrode.

In the present method, the distance between the adjacent signal lines are determined once the plurality of channels are formed. For example, a pitch of the plurality of signal lines is determined once the plurality of channels are formed.

Accordingly, forming the recess does not increase the distance and the pitch between the adjacent signal lines. In one example, the insulating material filling in the channel can be etched to form the recess.

In some embodiments, and referring to FIG. 2A, the method further includes forming a plurality of conductive connectors respectively in the plurality of recesses, each individual one of the plurality of conductive connectors is electrically connected to the respective one of the plurality of signal lines. Optionally, the plurality of conductive connectors is at least partially embedded in the insulating layer on a side distal to the base substrate. Optionally, a side of the plurality of conductive connectors distal to the base substrate is leveled with the exposed surface of the insulating layer distal to the base substrate. Subsequently, an electrode may be formed to be electrically connected to one of the plurality of conductive connectors. In one example, a portion of a conductive connector is in direct contact with (e.g., without any intermediate structure or layer) an adjacent signal lines, and another portion of the conductive connector is in direct contact with (e.g. without any intermediate structure or layer) the electrode. Because the width of the signal line is relatively small, the electrode may not be effectively connected to the signal line without a conductive connector. Therefore, the conductive connector can increase the connecting area between the signal line and the electrode to enhance the electrical contact performance.

In some embodiments, the plurality of conductive connectors can be formed using a sputtering process and optionally followed by an etching process. The plurality of conductive connectors respectively fill in the plurality of recesses, and are respectively electrically connected to the plurality of signal lines. Optionally, a plurality of electrodes are subsequently formed to be respectively electrically connected to the plurality of conductive connectors.

Various appropriate conductive materials and various appropriate fabricating methods may be used for making the plurality of conductive connectors. For example, a conductive material may be sputtered into the plurality of recesses. Examples of appropriate conductive materials for making the plurality of conductive connectors include, but are not limited to, various metal materials such as nano-silver, molybdenum, aluminum, silver, chromium, tungsten, titanium, tantalum, copper, and alloys or laminates containing the same; and various conductive metal oxides such as indium tin oxide. Optionally, the plurality of conductive connectors are made of Cu, Al, or Ag.

In some embodiments, the width of the surface of the conductive connector distal to the base substrate substantially parallel to a main surface of the base substrate (e.g., substantially along a direction from the first side to the second side) is in a range of approximately 3 µm to approximately 5 µm, e.g., approximately 3 µm to approximately 4 and approximately 4 µm to approximately 5 µm. Optionally, the depth of the conductive connector along a direction from the base substrate to the insulating layer is a range of approximately 3 µm to approximately 5 µm, e.g., approximately 3 µm to approximately 4 µm, and approximately 4 µm to approximately 5 µm. Optionally, the aspect ratio of the conductive connector is in a range of approximately 1:1 to 5:3. Therefore, the area of the surface of the conductive connector distal to the base substrate is greater than the area of the corresponding surface of the corresponding signal line. For example, the width of the surface of the conductive connector distal to the base substrate along a direction from the first side S1 to the second side S2 is 3 µm. For example, the depth of the conductive connector along a direction from the base substrate to the insulating layer is 5 µm.

In some embodiments, subsequent to forming the plurality of conductive connectors in the plurality of recesses, a portion of the conductive connector protruding outwardly along a direction away from the base substrate is removed to make sure that each signal line is insulated with each other, thereby the surfaces of the plurality of conductive connectors are substantially leveled with the exposed surface of the insulating layer.

In some embodiments, subsequent to forming the plurality of recesses and forming the plurality of conductive connectors, an electrode insulating layer and electrodes are formed on a side of the insulating layer distal to the base substrate. Optionally, the electrodes are formed to be respectively connected to surfaces of the plurality of conductive connectors respectively through vias extending through the electrode insulating layer.

In some embodiments, the plurality of conductive connectors are not formed. Optionally, the electrodes are formed to be respectively directly connected to lateral sides of the plurality of signal lines though vias extending through the electrode insulating layer. Because the depth of each of the plurality of signal lines substantially along a direction substantially perpendicular to a main surface of the base substrate (e.g., substantially along the direction from the base substrate toward the insulating layer) is greater than the width of the plurality of signal lines substantially along a direction substantially parallel to a main surface of the base substrate (e.g., substantially along the direction from the first side to the second side), an enhanced electrical connection performance of the electrodes and the signal lines can be achieved. However, this alternative method demands a higher accuracy for etching the vias.

Figure 3A:
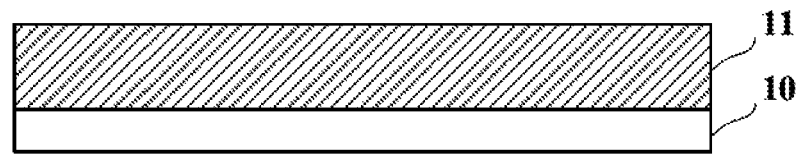
FIGS. 3A to 3H are partial cross-sectional views of a substrate with respect to different phases in the fabricating method of a substrate in some embodiments according to the present disclosure.
Figure 3B:
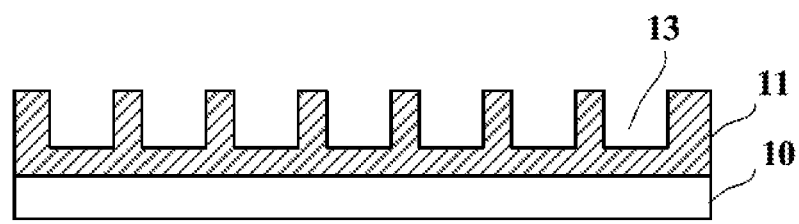
Figure 3C:
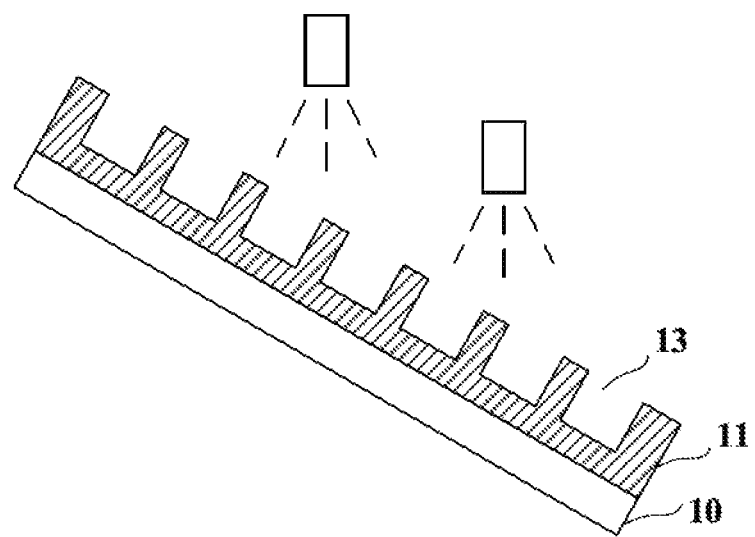
Figure 3D:
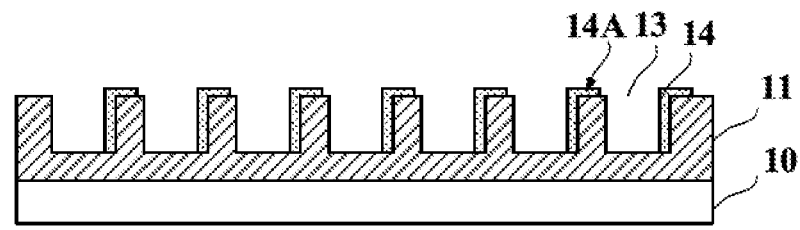
Figure 3E:
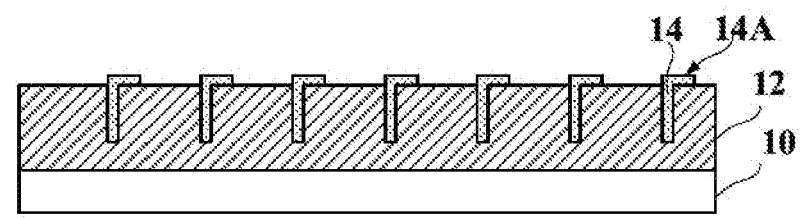
Figure 3F:
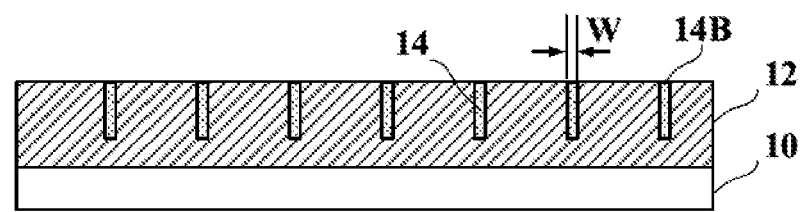
Figure 3G:
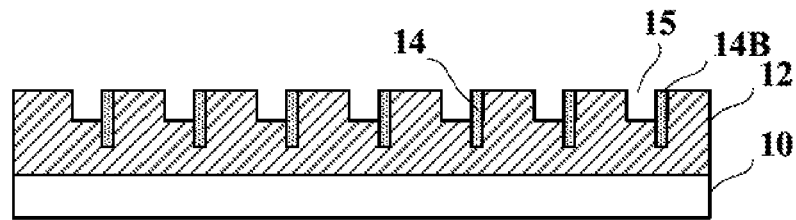

FIGS. 3A to 3H are partial cross-sectional views of a substrate with respect to different phases of the fabricating method of a substrate in some embodiments according to the present disclosure. Referring to FIG. 3A, an insulating material layer 11 is formed on the base substrate 10. Referring to FIG. 3B, a plurality of channels 13 are formed to extend into the insulating material layer 11 on a side distal to the base substrate 10. Referring to FIG. 2B and FIG. 3B, each of the plurality of channels 13 having a first side S1, a second side S2 facing the first side S1, and a third side S3 connecting the first side S1 and the second side S2. Referring to FIG. 3C, the base substrate 10 with the insulating layer 12 is disposed into sputtering chamber. The base substrate 10 is inclined with respect to the horizontal level. Sputtering the conductive material is performed along a sputtering direction inclined with respect to a plane substantially parallel to a main surface of the base substrate 10. Referring to FIG. 2B, FIG. 3C and FIG. 4C, a plurality of signal lines 14 are respectively formed on the plurality of the second sides S2 of the plurality of channels 13 using sputtering process. A portion 14A of each of the plurality of signal lines protrudes outwardly along a direction away from the base substrate 10. As shown in FIG. 3D, the portion 14A is at least partially on the exposed surface of the insulating material layer 11 between two adjacent channels of the plurality of channels 13. Referring to FIG. 3E, an insulating material is filled in the plurality of channels 13 using a coating process, thereby forming an insulating layer 12. The surface of the insulating material filled in the plurality of channels substantially leveled with the exposed surface of the insulating material layer, so that the surface of the insulating layer 12 is substantially leveled. Optionally, the coating process may cover the surfaces of the plurality of signal lines 14 with the insulating material. Optionally, the insulating material above the surfaces of the plurality of signal lines 14 is etched, thereby exposing the portion 14A of the plurality of signal lines protruding outwardly along a direction away from the base substrate 10. Referring to FIG. 3F, the portion of the signal line protruding outwardly along a direction away from the base substrate 10 is removed. Optionally, the surface 14B of each of the plurality of signal lines 14 and the exposed surface of insulating layer are substantially leveled. Referring to FIG. 3G, a plurality of recesses 15 are formed in the insulating layer 12. Each of the plurality of recesses 15 is formed next to a respective one of the plurality of the signal lines 14, exposing a lateral surface of the respective one of the plurality of signal lines 14. Referring to FIG. 3B, a plurality of the conductive connectors 16 is respectively formed in the plurality of the recesses 15, each individual one of the plurality of conductive connectors 16 is electrically connected to the respective one of the plurality of signal lines 14. Optionally, the plurality of the conductive connectors 16 is respectively in direct contact with (e.g. without any intermediate structure or layer) the plurality of the signal lines 14.

Figure 4A:
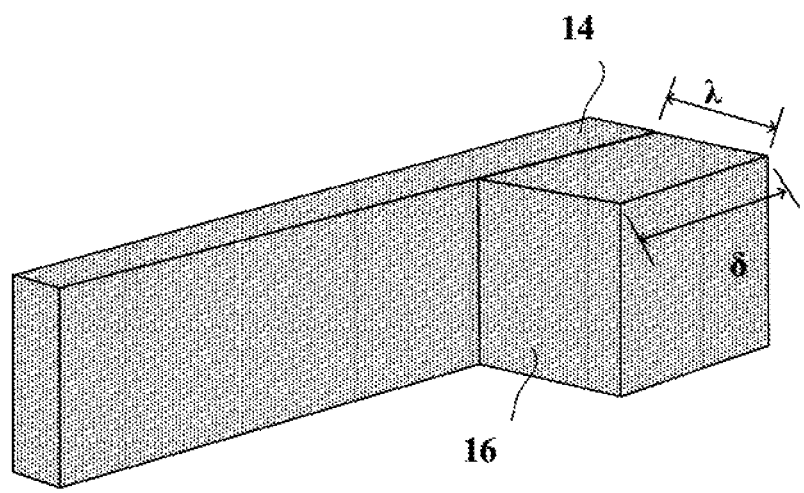
FIGS. 4A to 4B are perspective views of a conductive connector connecting two signal lines in some embodiments according to the present disclosure.
Figure 4B:
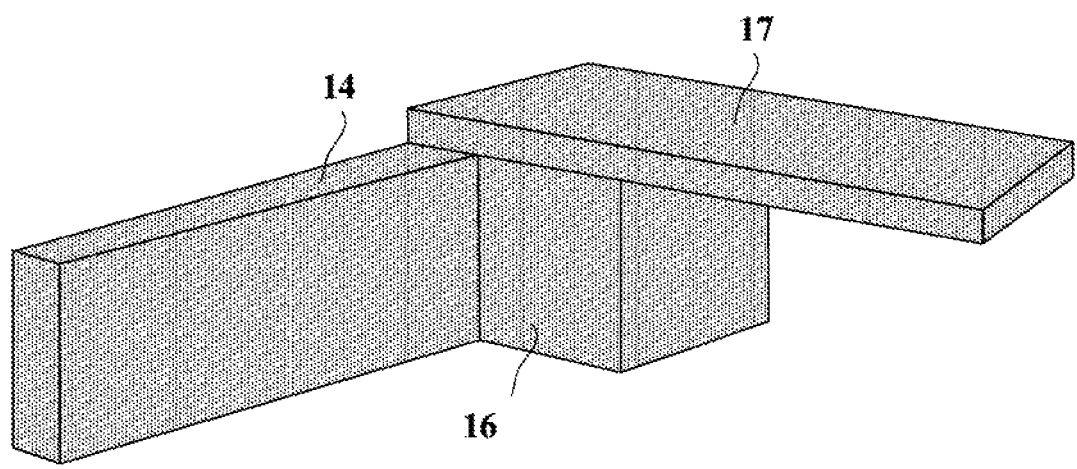

FIGS. 4A to 4B are perspective views of a conductive connector connecting two signal lines in some embodiments according to the present disclosure. Referring to FIGS. 4A to 4B, one of the plurality of conductive connectors 16 connects one of a plurality of signal lines 14 and one of a plurality of connecting signal lines 17. The one of a plurality of signal lines 14 and the one of a plurality of connecting signal lines 17 in FIG. 4B are substantially perpendicular to each other. Optionally, referring to both FIG. 2B and FIG. 4A, the width λ of the conductive connector along a direction from the first side S1 toward the second side S2 of the plurality of channels 13 is longer than the width W of the signal line along the same direction. Optionally, the length δ of the one of the plurality of conductive connectors 16 along a direction along the length direction of the one of the plurality of signal lines 14 is shorter than the length of the one of a plurality of signal lines 14. The one of the plurality of connecting signal lines 17 is on a side of the insulating layer and the one of the plurality of conductive connectors 16 distal to the base substrate. Optionally, the substrate is a touch-control substrate, the plurality of connecting signal lines 17 are a touch-control signal line. Optionally, the substrate is a display substrate, the plurality of connecting signal lines 17 are display control signal lines such as gate lines, date lines, and common electrode signal lines.

Figure 5A:
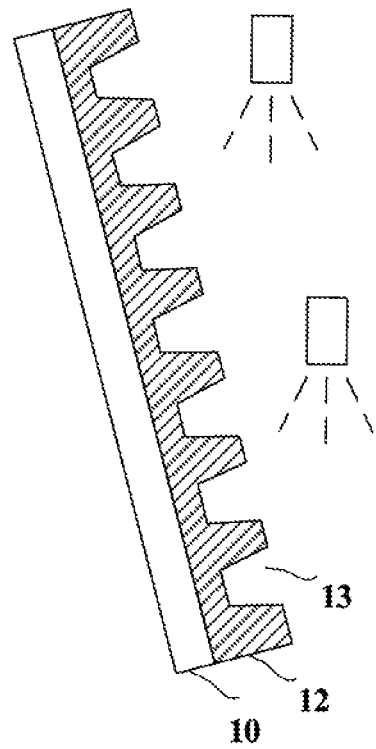
FIGS. 5A to 5C illustrates various shapes of a cross-section of a plurality of channels in some embodiments according to the present disclosure.
Figure 5B:
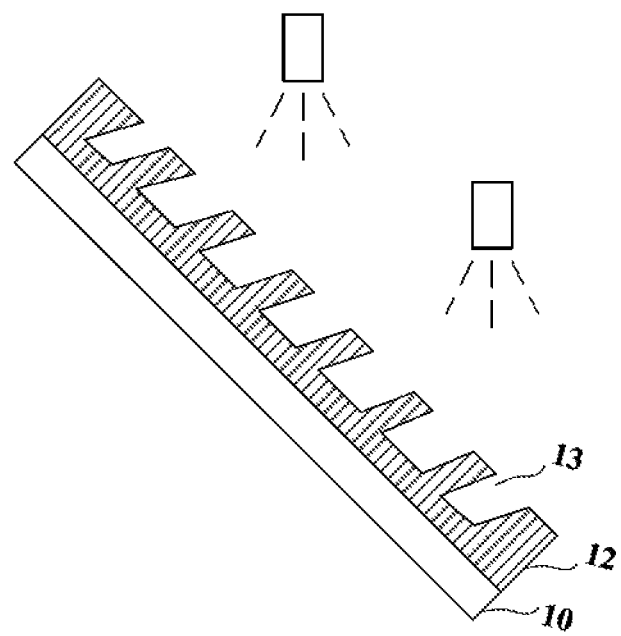
Figure 5C:
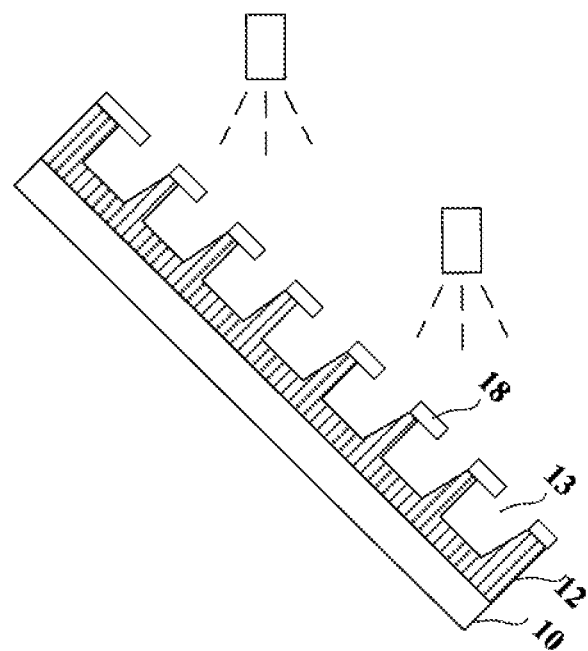

FIGS. 5A to 5C illustrates various shapes of a cross-section of a plurality of channels in some embodiments according to the present disclosure. Referring to FIG. 5A, each of the plurality of channels 13 has a cross-section of a trapezoidal shape, which facilitates deposition of the sputtered conductive material selectively on only one lateral side of the plurality of channels 13. Referring to FIG. 5B, each of the plurality of channels 13 has a cross-section of a parallelogram shape, which further facilitates deposition of the sputtered conductive material selectively on only one lateral side of the plurality of channels 13. The bottom side and another lateral side of the plurality of channels 13 is substantially free of sputtered conductive material. Referring to FIG. 5G, in some embodiments, a plurality of barriers 18 are formed or disposed on the substrate doling the sputtering process, thereby preventing the sputtering conductive material from depositing on the bottom side and another lateral side of the plurality of channels 13.

In another aspect, the present disclosure provides a substrate. In some embodiments, the substrate includes a base substrate; an insulating, layer on the base substrate; and a plurality of signal lines at least partially embedded in the insulating layer. Optionally, each of the plurality of signal lines has a width substantially along a direction substantially parallel to a main surface of the base substrate in a range of approximately 100 nm to approximately 800 nm, e.g., approximately 100 nm to approximately 200, approximately 200 nm to approximately 300, approximately 300 nm to approximately 400, approximately 400 nm to approximately 500, approximately 500 nm to approximately 600, approximately 600 nm to approximately 700, and approximately 700 nm to approximately 800. Optionally, each of the plurality of signal lines has a depth substantially along a direction substantially perpendicular to a main surface of the base substrate in a range of approximately 4 µm to approximately 15 µm, e.g., approximately 4 µm to approximately 5, approximately 5 µm to approximately 6 µm, approximately 6 µm to approximately 7 µm, approximately 7 µm to approximately 8 µm, approximately 8 µm to approximately 9 µm, approximately 9 µm to approximately 10 µm, approximately 10 µm to approximately 11 µm, approximately 11 µm to approximately 12 µm, approximately 12 µm to approximately 13 µm, approximately 13 µm to approximately 14 µm, and approximately 14 µm to approximately 15 µm. Optionally, each of the plurality of signal lines has a width substantially along a direction substantially parallel to a main surface of the base substrate and a depth substantially along a direction substantially perpendicular to a main surface of the base substrate; and an aspect ratio between the depth and the width is greater than 1:1. Optionally, the aspect ratio is in a range of approximately 1:1 to approximately 15:1, e.g., approximately 1:1 to approximately 5:1, approximately 5:1 to approximately 10:1, approximately 10:1 to approximately 15:1. Optionally, the aspect ratio is greater than 5:1, e.g., approximately 5:1 to approximately 50:1, approximately 50:1 to approximately 100:1, approximately 100:1 to approximately 150:1. Optionally, the plurality of signal lines have a pitch in a range of approximately 3 µm to approximately 11 µm, e.g., approximately 3 µm to approximately 4 µm, approximately 4 µm to approximately 5 µm, approximately 5 µm to approximately 6 µm, approximately 6 µm to approximately 7 µm, approximately 7 µm to approximately 8 µm, approximately 8 µm to approximately 9 µm, approximately 9 µm to approximately 10 µm, and approximately 10 µm to approximately 11 µm.

In some embodiments, the substrate further includes a plurality of conductive connectors at least partially embedded in the insulating layer, each individual one of the plurality of conductive connectors is electrically connected to the respective one of the plurality of signal lines.

In some embodiments, the substrate further includes a plurality of connecting signal lines on a side of the insulating layer distal to the base substrate, each individual one of the plurality of connecting signal lines being electrically connected to a respective one of the plurality of conductive connectors.

Various appropriate conductive materials and various appropriate fabricating methods may be used for making the plurality of signal lines, the plurality of conductive connectors, and the plurality of connecting signal lines. Examples of appropriate conductive materials for making the plurality of signal lines, the plurality of conductive connectors, and the plurality of connecting signal lines include, but are not limited to, various metal materials such as nano-silver, molybdenum, aluminum, silver, chromium, tungsten, titanium, tantalum, copper, and alloys or laminates containing the same; and various conductive metal oxides such as indium tin oxide. Optionally, the plurality of signal lines, the plurality of conductive connectors, and the plurality of connecting signal lines are made of Cu, Al, or Ag.

Various appropriate insulating materials and various appropriate fabricating methods may be used to make the insulating layer. Examples of appropriate insulating materials for making the insulating layer include, but are not limited to, acrylic materials, silicon oxide (SiO), silicon nitride ($SiN_y$, e.g., $Si_3N_4$), oxynitride ($SiO_xN_y$), polyimide and other over coating materials. Optionally, the insulating layer is made of one or a combination of acrylate and a protection film.

Figure 6:
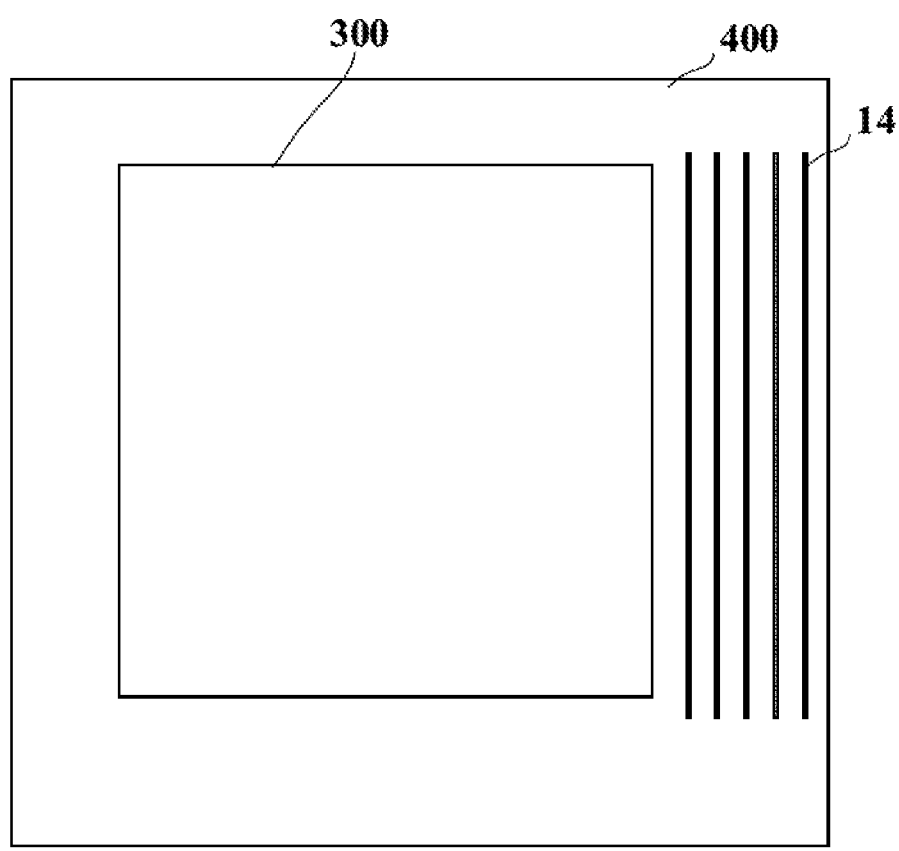
FIG. 6 is a schematic diagram illustrating a structure of a substrate in some embodiments according to the present disclosure.

FIG. 6 is a schematic diagram illustrating a structure of a substrate in some embodiments according to the present disclosure. Referring to FIG. 6, a substrate includes a central area 300 and a peripheral area 400 surrounding the central area 300. Optionally, the peripheral area 400 is used to dispose the plurality of signal lines 14. Optionally, the substrate is a touch-control substrate. Optionally, the substrate is a display substrate.

In some embodiments, the substrate is the touch-control substrate. Optionally, the central area 300 is a touch-control area. Optionally, the touch-control area is used to dispose touch-control electrodes. Optionally, the plurality of signal lines 14 in the peripheral area 400 are respectively connected to the touch-control electrodes in the touch-control area.

In some embodiments, the substrate is the display substrate. Optionally, the central area 300 is a display area. Optionally, the display area is used to dispose a plurality of subpixels (e.g., light emitting elements). Optionally, the plurality of signal lines 14 in peripheral area 400 are respectively electronically connect to the electrodes or display signal lines of pixel structure such as gate lines, data lines, anodes, cathodes and so on.

Figure 7:
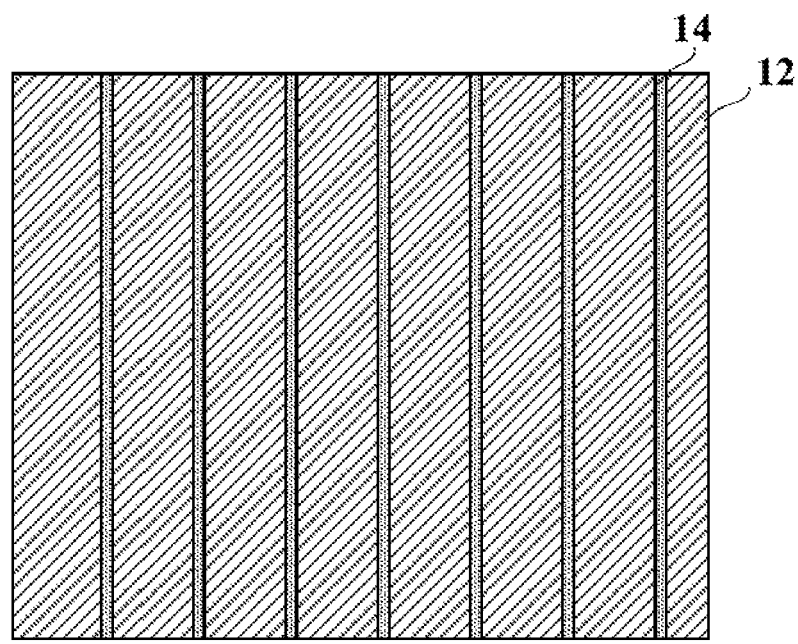
FIG. 7 is a partial schematic diagram illustrating a structure of a substrate in some embodiments according to the present disclosure.

FIG. 7 is a partial schematic diagram illustrating a structure of a substrate in some embodiments according to the present disclosure. FIG. 7 is a zoom-in view of the peripheral area in FIG. 6. Referring to FIG. 3F, FIG. 2B and FIG. 7, the substrate includes a base substrate 10, an insulating layer 12, and a plurality of signal lines 14. Optionally, the insulating layer 12 is disposed on the base substrate 10. Optionally, the plurality of the signal lines 14 extend into the insulating layer 12 on a side distal to the base substrate 10.

Figure 3H:
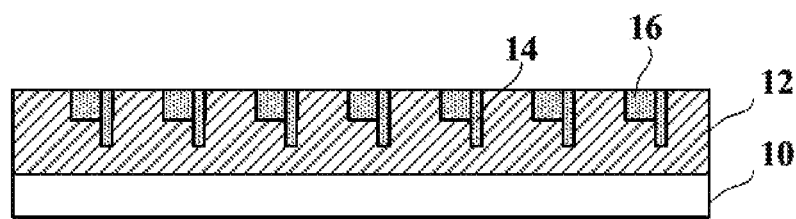

In some embodiments, referring to FIG. 3H, the substrate includes a plurality of conductive connectors 16. Optionally, the plurality of the conductive connectors 16 is extended into a side of the insulating layer 12 distal to the base substrate 10. Optionally, the plurality of the conductive connectors 16 connects with the plurality of the signal lines 14 correspondingly. Optionally, the plurality of the conductive connectors 16 connects with electrodes. Optionally, the surfaces of the plurality of the conductive connectors 16 distal to the base substrate 10 are leveled with the exposed surface of the insulating layer 12 distal to the base substrate 10.

In some embodiments, the insulating layer 12 can be directly disposed on the base substrate 10. Optionally, the substrate is a touch-control substrate. And the insulating layer 12 is in direct contact with (e.g. without any intermediate structure or layer) the base substrate 10. Optionally, the touch-control substrate includes an electrode insulating layer which is disposed on a side of the insulating layer 12 distal to the base substrate. Optionally, the touch-control includes a touch-control electrode which is disposed on a side of the electrode insulating layer distal to the base substrate 10. Optionally, the touch-control electrodes connect with the signal lines through vias in the electrode insulating layer. Optionally, signal lines are a plurality of touch control signal lines.

In some embodiments, the insulating layer 12 can be disposed on the base substrate without direct contact. Optionally, the substrate is a display substrate. And a gate electrode layer (e.g. gate lines), a gate insulating layer, and an active layer, etc. are disposed on the base substrate 10. Optionally, the insulating layer 12 is disposed on a side of the active layer distal to the base substrate. Optionally, the signal lines extended in the insulating layer is date line, e.g., a plurality of gate lines, a plurality of data lines, a plurality of common electrode signal lines and so on. Optionally, the display substrate includes a flat layer and so on.

In some embodiments, the substrate is formed according to the fabricating method illustrated in FIG. 1A or FIG. 2A. FIG. 1A or FIG. 2A illustrate the fabricating methods and the structure of the base substrate, insulating layer and a plurality of signal lines in details.

In another aspect, the present disclosure provides an electronic apparatus which includes the substrate described in the present disclosure or fabricated by a method described herein. In some embodiments, the electronic apparatus is a product or component having a display function or a touch-control function, including a mobile phone, a pad, a television, a monitor, a portable computer, a digital photo frame, a navigator and so on.

In another aspect, the present disclosure provides a touch panel having the substrate described herein or fabricated by a method described herein.

In another aspect, the present disclosure provides a display apparatus having the substrate described herein or fabricated by a method described herein. Examples of appropriate touch control display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such will's should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a substrate, comprising:
    forming an insulating material layer on a base substrate;
    forming a plurality of channels extending into the insulating material layer; and
    forming a plurality of signal lines respectively in the plurality of channels, each individual one of the plurality of signal lines being formed on a lateral side of a respective one of the plurality of channels.

2. The method of claim 1, wherein each of the plurality of signal lines is formed to have a width substantially along a direction substantially parallel to a main surface of the base substrate in a range of approximately 100 nm to approximately 800 nm.

3. The method of claim 1, wherein each of the plurality of signal lines is formed to have a depth substantially along a direction substantially perpendicular to a main surface of the base substrate in a range of approximately 4 μm to approximately 15 μm.

4. The method of claim 1, wherein the plurality of signal lines are formed to have a pitch in a range of approximately 3 μm to approximately 11 μm.

5. The method of claim 1, wherein each of the plurality of signal lines is formed to have a width substantially along a direction substantially parallel to a main surface of the base substrate and a depth substantially along a direction substantially perpendicular to a main surface of the base substrate; and
    an aspect ratio between the depth and the width is greater than 5:1.

6. The method of claim 1, wherein forming the plurality of signal lines respectively in the plurality of channels comprises sputtering a conductive material onto the lateral side of the respective one of the plurality of channels;
    wherein sputtering the conductive material is performed along a sputtering direction inclined with respect to a plane substantially parallel to a main surface of the base substrate.

7. The method of claim 6, wherein an inclined angle between the sputtering direction and the plane substantially parallel to the main surface of the base substrate is in a range of approximately 30 degrees to approximately 60 degrees.

8. The method of claim 1, subsequent to forming the plurality of signal lines respectively in the plurality of channels, further comprising:
    filling the plurality of channels using an insulating material thereby forming an insulating layer; and
    removing a portion of the plurality of signal lines protruding outwardly along a direction away from the base substrate thereby substantially leveling an exposed surface of the plurality of signal lines and an exposed surface of insulating layer.

9. The method of claim 8, wherein removing the portion of the plurality of signal lines comprises etching the portion of the plurality of signal lines with an acidic etchant.

10. The method of claim 8, subsequent to filling the plurality of channels, further comprising:
    forming a plurality of recesses in the insulating layer, each individual one of the plurality of recesses being formed to abut a respective one of the plurality of signal lines, thereby exposing a lateral surface of the respective one of the plurality of signal lines; and
    forming a plurality of conductive connectors respectively in the plurality of recesses, each individual one of the plurality of conductive connectors is electrically connected to the respective one of the plurality of signal lines.

11. The method of claim 10, subsequent to forming the plurality of conductive connectors, further comprising:
    forming a plurality of connecting signal lines on a side of the insulating layer distal to the base substrate, each individual one of the plurality of connecting signal lines being electrically connected to a respective one of the plurality of conductive connectors.

12. The method of claim 1, wherein each of the plurality of channels is formed to have a width substantially along a direction substantially parallel to a main surface of the base substrate and a depth substantially along a direction substantially perpendicular to a main surface of the base substrate;
    the width is in a range of approximately 1 μm to approximately 6 μm; and
    the depth is in a range of approximately 4 μm to approximately 15 μm.

* * * * *